United States Patent
Lee et al.

(10) Patent No.: US 8,119,460 B2
(45) Date of Patent: Feb. 21, 2012

(54) SEMICONDUCTOR DEVICE AND METHOD OF FORMING THE SAME

(75) Inventors: Jin-Sung Lee, Gwangju-si (KR); Woon-Kyung Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/240,575

(22) Filed: Sep. 22, 2011

(65) Prior Publication Data
US 2012/0007193 A1   Jan. 12, 2012

Related U.S. Application Data

(63) Continuation of application No. 12/381,380, filed on Mar. 11, 2009, now Pat. No. 8,053,848.

(30) Foreign Application Priority Data

Mar. 12, 2008 (KR) .................. 10-2008-0022993

(51) Int. Cl.
*H01L 21/332* (2006.01)

(52) U.S. Cl. ........ 438/140; 438/197; 257/350; 257/355; 257/372; 257/409

(58) Field of Classification Search ............... 257/350, 257/355, 372, 409; 438/134, 197, 199, 270, 438/275, 279, 140
See application file for complete search history.

(56) References Cited

U.S. PATENT DOCUMENTS

| 5,023,689 A * | 6/1991 | Sugawara ............... 257/372 |
| 5,719,733 A | 2/1998 | Wei et al. |
| 6,621,133 B1 | 9/2003 | Chen et al. |
| 6,897,524 B2 | 5/2005 | Kamiya |
| 2003/0174452 A1 | 9/2003 | Chen et al. |
| 2005/0051840 A1 | 3/2005 | Iida |
| 2009/0230457 A1 | 9/2009 | Lee et al. |

FOREIGN PATENT DOCUMENTS

KR   1020060001305   1/2006

OTHER PUBLICATIONS

"Semiconductor Device and Method of Forming the Same" Specification, Drawings and Prosecution History, of U.S. Appl. No. 12/381,380, filed Mar. 11, 2009, by Jin-Sung Lee, et al., which is stored in the U.S. Patent and Trademark Office (USPTO).

* cited by examiner

*Primary Examiner* — Telly Green
(74) *Attorney, Agent, or Firm* — Onello & Mello, LLP

(57) ABSTRACT

A semiconductor device includes a plurality of transistors disposed on a semiconductor substrate, a device isolation layer disposed around the transistors, a guard ring disposed to surround the device isolation layer and the transistors, and a guard region disposed between adjacent transistors.

17 Claims, 14 Drawing Sheets

(A)

(B)

SEMICONDUCTOR DEVICE AND METHOD OF FORMING THE SAME

CROSS-REFERENCE TO RELATED APPLICATIONS

This U.S. non-provisional patent application is a continuation application of U.S. patent application Ser. No. 12/381,380, filed on Mar. 11, 2009, which claims priority under 35 U.S.C §119 to Korean Patent Application 10-2008-0022993, filed in the Korean Intellectual Property Office on Mar. 12, 2008, the entirety of which is hereby incorporated by reference.

FIELD OF THE INVENTION

The present invention relates to semiconductor devices and, more specifically, to a high-voltage NMOS device having a guard ring structure.

BACKGROUND OF THE INVENTION

Snapback in a semiconductor device occurs when a drain voltage of a saturated metal oxide semiconductor field transistor (MOSFET) increases over a determined level, and, as a result, drain current increases rapidly. A snapback voltage is a breakdown voltage when a channel is formed between a drain and a source. Among electrons and holes generated by a horizontal field of a channel direction, a hole is ejected to a substrate to lower a junction barrier of the source and the substrate, which may result in the snapback. Specifically, when a drain voltage of a saturated MOST ET increases, pinchoff becomes greater to make a depletion region wider at a drain region. Electrons passing the depletion region gain a considerable amount of kinetic energy from an electric field to turn into hot carriers. The hot carriers collide against the lattice of a covalently bonded substrate to form electrons and holes. At this point, substrate leakage current is generated while the holes travel toward the substrate. Due to the leakage current, voltage drop occurs at the substrate to create a forward bias at a PN junction between the source and the substrate. The forward bias allows electrons of the source to be easily ejected to the substrate. The voltage drop may be proportional to a substrate resistance Rsub. The electron ejected from the source gains energy to form an electron-hole pair while traveling toward the drain. Leakage current flowing to the substrate is also caused by the electron-hole pair, resulting in positive feedback. The above-described mechanism is identical to that of a bipolar junction transistor (BJT). Thus, in the case of an N channel MOS (NMOS) FET, an N-type source, a P-type substrate, and an N-type drain correspond to an emitter, a base, and a collector, respectively, of a BJT.

SUMMARY OF THE INVENTION

Exemplary embodiments of the present invention provide a semiconductor device. In an exemplary embodiment, the semiconductor device may include: a plurality of transistors disposed on a semiconductor substrate; a device isolation layer disposed around the transistors; a guard ring disposed at the semiconductor substrate to surround the device isolation layer and the transistors; and a guard region disposed between adjacent transistors.

In one embodiment, the guard region is electrically connected to the guard ring.

In one embodiment, the guard region and/or the guard ring is connected to a guard contact plug.

In one embodiment, each of the transistors comprises a gate insulator, a gate electrode and source and drain. The source and drain can be N-type impurity regions formed on the semiconductor substrate, and the guard ring and the guard region can exhibit P-type conductivity. In one embodiment, the source and drain are connected to a metal contact plug, and the guard region and/or the guard ring is connected to a guard contact plug. In one embodiment, the guard region is grounded.

In one embodiment, the transistors are high-voltage NMOS elements.

In one embodiment, both ends of the guard region are in contact with the guard ring.

In one embodiment, one end of the guard region is in contact with the guard ring, and the other end of the guard ring is not in contact with the guard ring.

In one embodiment, the semiconductor substrate includes a cell region and a peripheral circuit region, and the peripheral circuit region includes the plurality of transistors. The cell region includes memory cells connected in series, a string selection element connected to one end of the memory cells connected in series, a ground selection element connected to the other end of the memory cells connected in series, and a common source line to connect the ground selection element to an adjacent ground selection element. In one embodiment, the semiconductor device further comprises a guard contact plug being in contact with the guard region. In one embodiment, the guard contact plug and the common source line are made of the same material. In one embodiment, the guard contact plug is grounded. In one embodiment, the memory cells comprise a tunnel insulator on a semiconductor substrate, a charge storage layer on the tunnel insulator, a blocking insulating layer on the charge storage layer, and a control gate electrode on the blocking insulating layer. In one embodiment, the blocking insulating layer is entirely or partially removed at the string selection element and the ground selection element to contact the charge contact layer with the control gate electrode. In one embodiment, a gate structure of the memory cells in the cell region is different from that of the transistors in the peripheral circuit region.

Exemplary embodiments of the present invention also provide a method of forming a semiconductor device. In an exemplary embodiment, the method may include: forming a plurality of transistors on a P-type semiconductor substrate; forming a device isolation layer around the transistors; forming a P-type guard ring on the semiconductor substrate to surround the device isolation layer and the transistors; forming a guard region on the semiconductor substrate between adjacent transistors; and forming a guard contact plug on the guard region.

In one embodiment, the guard region and the P-type guard ring are formed at the same time.

In one embodiment, the P-type semiconductor substrate includes a cell region and a peripheral circuit region. The cell region includes memory cells connected in series, a string selection element connected to one end of the memory cells connected in series, a ground selection element connected to the other end of the memory cells connected in series, and a common source line to connect the ground selection element to an adjacent ground selection element. The common source line and the guard contact plug are formed at the same time.

BRIEF DESCRIPTION OF THE DRAWINGS

The foregoing and other features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF PREFERRED EMBODIMENTS

The present invention will be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. It will be understood that when a layer is referred to as being "on" another layer or substrate, it can be directly on the other layer or substrate, or intervening layers may also be present.

Figure 1A:
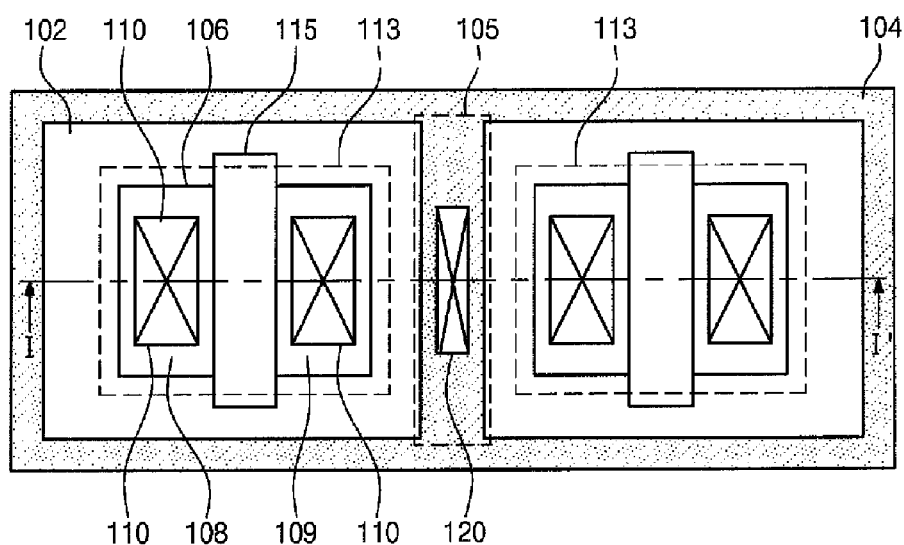
FIGS. 1A and 1B are a top plan view and a cross-sectional view, respectively, of a high-voltage element including a guard region to suppress snapback according to an embodiment of the present invention.
Figure 1B:
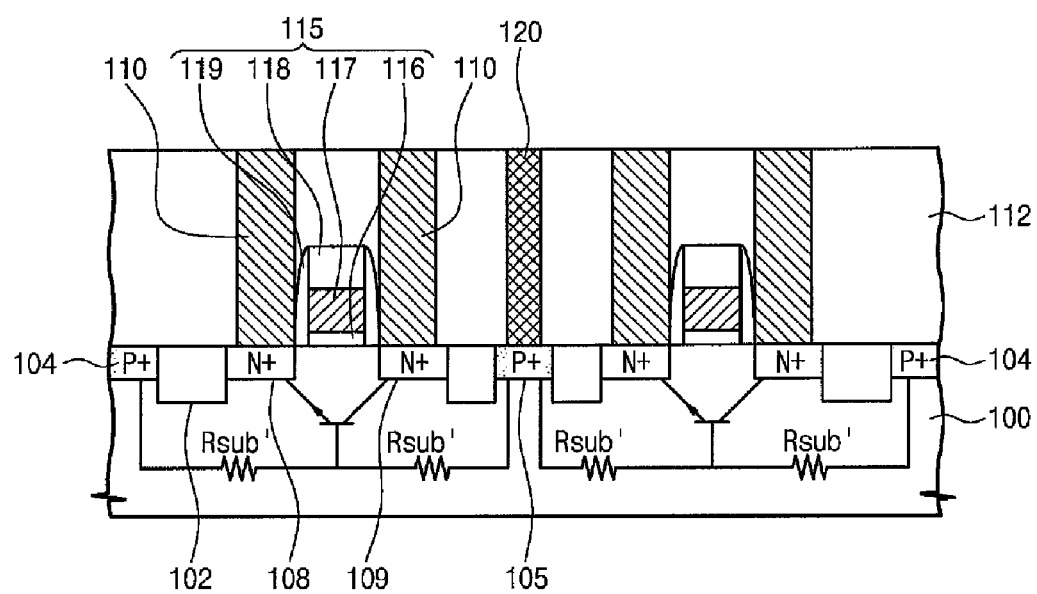

FIGS. 1A and 1B are a top plan view and a cross-sectional view, respectively, of a high-voltage element including a guard region to suppress snapback according to an embodiment of the present invention. In particular, FIG. 1B is a cross-sectional view taken along a line I-I' of FIG. 1A.

Referring to FIGS. 1A and 1B, high-voltage elements may include a plurality of MOS transistors 113, a device isolation layer 102, a guard ring 104, and a guard region 105 on a semiconductor substrate 100. The device isolation layer 102 may be disposed to surround the MOS transistors 113. An active region 106 is defined by the device isolation layer 102. The device isolation layer 102 may be formed by means of a shallow trench isolation (STI) process. The guard ring 104 may be disposed to surround the device isolation layer 102 and the MOS transistors 113. The guard region 105 is disposed between MOS transistors that are adjacent to each other. That is, each of the MOS transistors 113 may be surrounded by the device isolation layer 102 that may be surrounded by the guard ring 104 and the guard region 105.

Each of the MOS transistors 113 may include a gate 115, a source 108, and a drain 109. The source 108 and the drain 109 may correspond to an emitter and a collector of a parasitic bipolar transistor, respectively. A semiconductor substrate 100 between the source 108 and the drain 109 may correspond to a base of the parasitic bipolar transistor.

The guard ring 104 and the guard region 105 may be disposed to surround the respective MOS transistors 113. The guard region 105 may be grounded through a guard contact plug 120. The guard ring 140 and the guard region 105 may be in contact with each other. Specifically, the guard region 105 is disposed across the guard ring 104, allowing both ends of the guard region 105 to be in contact with the guard ring 104.

As described above, the guard contact plug 120 is disposed on the guard region 105. However, according to a modified embodiment of the invention, the guard contact plug 120 may be disposed on the guard ring 104 and/or the guard region 105B to be electrically connected to the guard ring 104 and/or the guard region 105.

The gate 115 may include a gate insulator 116, a gate electrode 117, a capping pattern 118, and a spacer 119. A lower interlayer dielectric 112 may be disposed to cover the gate 115. A top surface of the lower interlayer dielectric 112 may be planarized. Source/drain 108 and 109 may be connected to a contact plug 110. The contact plug 110 may be disposed in the lower interlayer dielectric 112.

The gate insulator 116 may be formed to include at least one of silicon oxide, silicon oxynitride, and metal nitride. The gate electrode 117 may include doped polysilicon. The gate electrode 117 may have a multi-layer structure such as, for example, doped polysilicon and metal or metal silicide which are stacked in that order.

The capping pattern 118 may include at one of silicon nitride and silicon oxynitride and act as a hard mask during a step of forming the gate electrode 117. Sidewalls of the gate insulator 116, the gate electrode 117, and the capping pattern 118 may be aligned.

A spacer 119 may be disposed on the sidewall of the gate electrode 117 and include at least one of silicon oxide, silicon oxynitride, and silicon nitride.

The source/drain 108 and 109 may be formed by means of an ion implanting process or a diffusion process. The source/drain 108 and 109 may be doped with N-type impurities. A conductivity type of the impurities of the source/drain 108 and 109 may be opposite to that of the semiconductor substrate 100.

The guard ring 104 and the guard region 105 may be formed by introducing or diffusing impurities to the semiconductor substrate 100. The guard ring 104 and the guard region 105 may be doped with P-type impurities. Impurities of the guard ring 104 and the guard region 105 may have the same conductivity type. The conductivity type of the guard ring 104 and the guard region 105 may be identical or opposite to that of the source/drain 108 and 109. The lower interlayer dielectric 112 may be formed of silicon oxide and may be formed to cover the gate 115. A top surface of the lower interlayer dielectric 112 may be planarized.

The guard contact plug 120 may be disposed in the lower interlayer dielectric 112 to be in contact with the guard region 105. According to a modified embodiment of the invention, the guard contact plug 120 may be disposed on the guard region 105 and/or the guard ring 104. Alternatively, the guard contact plug 120 may be disposed on the entire surface of the guard region 105 and the guard ring 104. Each of the MOS transistors 113 is surrounded by the device isolation layer 102, the guard ring 104, and the guard region 105. A linear guard contact plug 120 having a length of at least 1 micrometer may surround the MOS transistors 113 along the guard ring 104 and the guard region 105.

The guard contact plug 120 may include at least one of doped polysilicon, metal, metal silicide, and barrier metal. The guard contact plug 120 may have a multi-layer structure.

The contact plug 110 may be disposed to be in contact with the source/drain 108 and 109 through the lower interlayer dielectric 112. The contact plug 110 may include at least of polysilicon, metal, metal silicide, and barrier metal. The contact plug 110 may be connected to a metal interconnection (not shown). The contact plug 110 may have a multi-layer structure. According to a modified embodiment of the invention, the contact plug 110 may include a landing pad (not shown).

Each of the MOS transistors 113 may be surrounded by the device isolation layer 102 that may be surrounded by the guard ring 104 and the guard region 105. Thus, a resistance of the semiconductor substrate 100 may be lowered to decrease voltage drop between the source of the MOS transistors 113 and the semiconductor substrate 110. As a result, snapback may be suppressed.

Figure 2:
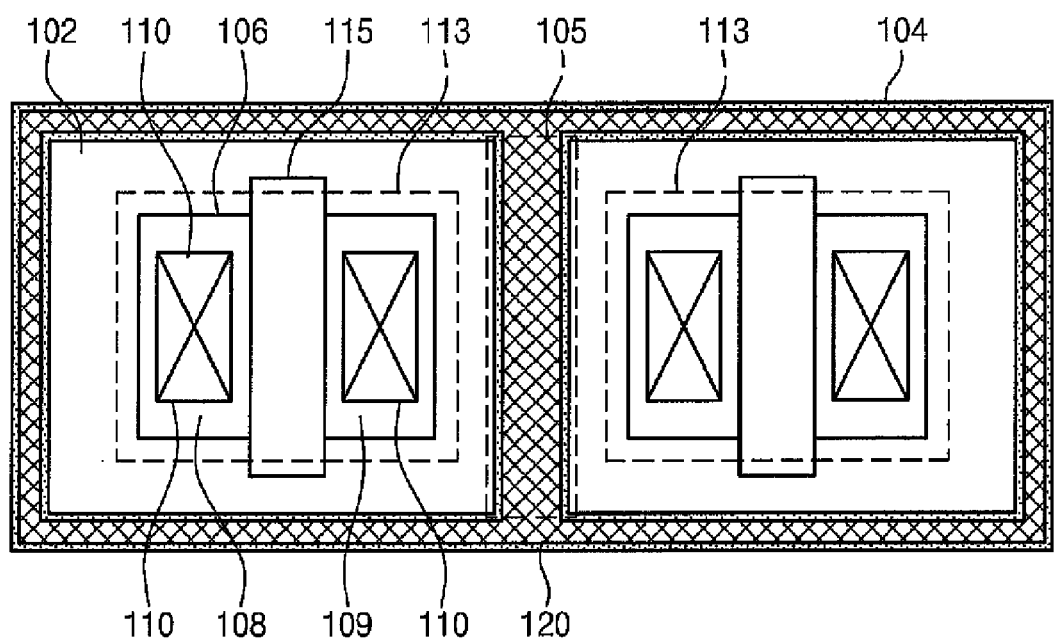
FIG. 2 is a top plan view of a high-voltage element including a guard region according to another embodiment of the present invention.

FIG. 2 is a top plan view of a high-voltage element including a guard region according to another embodiment of the present invention. The high-voltage element of FIG. 2 is identical to that of FIGS. 1A and 1B, except that a guard contact plug 120 is provided to surround MOS transistors 113 along a guard ring 104 and a guard region 105. The guard contact plug 120 may be grounded through an interconnection (not shown).

Figure 3A:
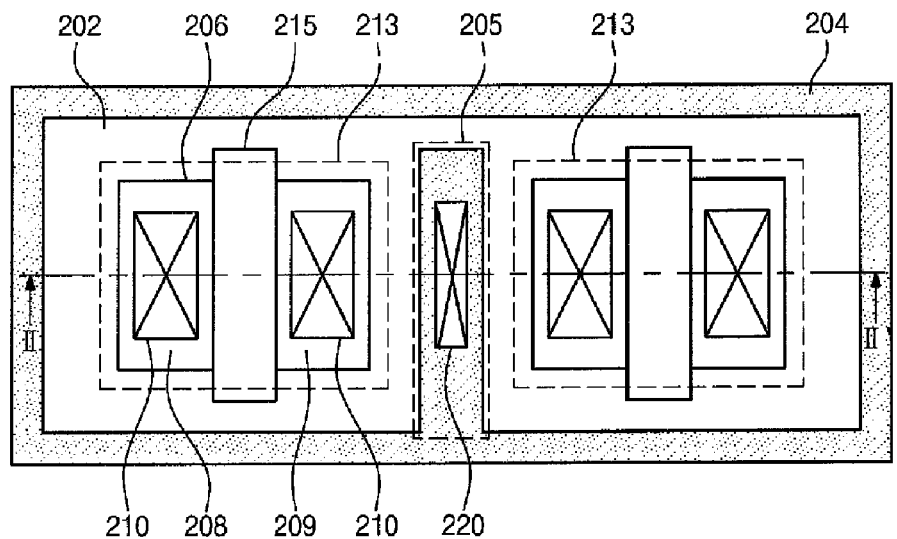
FIGS. 3A and 3B are a top plan view and a cross-sectional view, respectively, of a high-voltage element including a guard region to suppress snapback according to still another embodiment of the present invention.
Figure 3B:
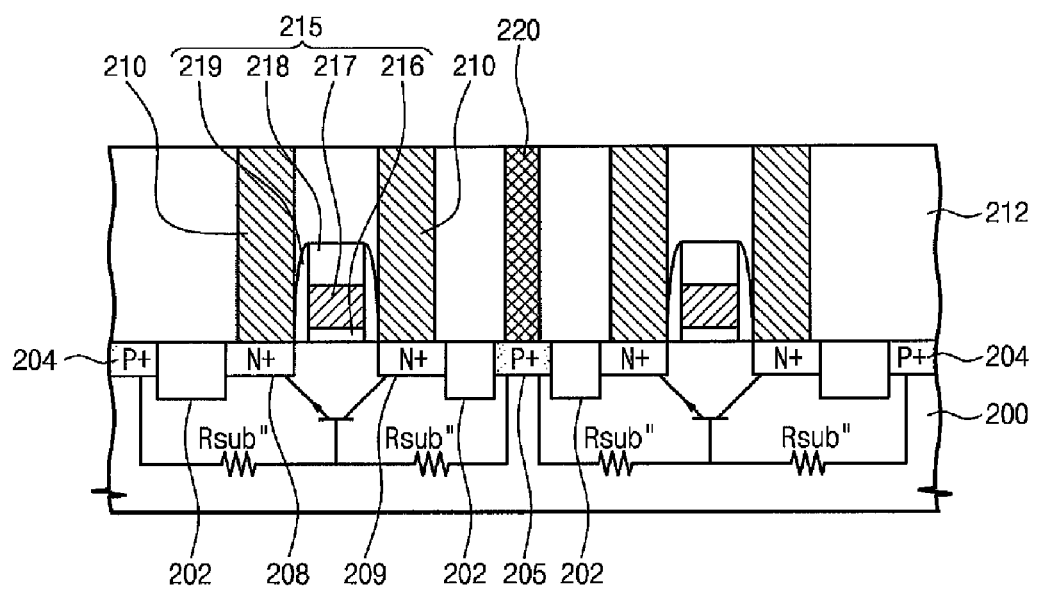

FIGS. 3A and 3B are a top plan view and a cross-sectional view, respectively, of a high-voltage element including a guard region according to still another embodiment of the present invention. In particular, FIG. 3B is a cross-sectional view taken along a line II-II' of FIG. 3A.

Referring to FIGS. 3A and 3B, high-voltage elements may include a plurality of MOS transistors 213, a device isolation layer 202, a guard ring 204, a guard region 205 on a semiconductor substrate 200. The device isolation layer 202 may be disposed to surround the respective MOS transistors 213. An active region 206 is defined by the device isolation layer 202. The device isolation layer 202 may be formed by means of a shallow trench isolation (STI) process. The guard ring 204 may be disposed to surround the device isolation layer 202 and the MOS transistors 213. A guard region 205 may be disposed between MOS transistors 213 that are adjacent to each other. One end of the guard region 205 may be in contact with the guard ring 204 and the other end of the guard region 205 may not be in contact with the guard ring 204. Each of the MOS transistors 213 may be surrounded by a device isolation layer 202 and partially surrounded by a guard ring 204 and a guard region 205.

Each of the MOS transistors 213 may include a gate 215, a source 208, and a drain 209. The source 208 and the drain 209 may correspond to an emitter and a collector of a parasitic bipolar transistor, respectively. A semiconductor substrate 200 between the source 208 and the drain 209 may correspond to a base of the parasitic bipolar transistor.

The guard ring 204 and the guard region 205 may be disposed to partially or entirely surround the respective MOS transistors 213. The guard region 205 may be grounded through a guard contact plug 220. The gate 215 may include a gate insulator 216, a gate electrode 217, a capping pattern 218, and a spacer 219. A lower interlayer dielectric 212 may be disposed to cover the gate 215. The lower interlayer dielectric 212 may be made of silicon oxide. Source/drain 208 and 209 of the MOS transistors 213 may be connected to a contact plug 210 that may be disposed to penetrate the lower interlayer dielectric 212. The guard contact plug 220 may be disposed to contact the guard region 205 in the lower interlayer dielectric 212.

According to a modified embodiment of the invention, the guard contact plug 220 may be disposed on the guard region 205 and/or the guard ring 204. The guard contact plug 220 may be disposed on the entire surface of the guard region 205 and the guard ring 204. Description of elements of FIGS. 3A and 3B that are essentially the same as those of FIGS. 1A and 1B will not be repeated.

Each of the MOS transistors 213 may be surrounded by the device isolation layer 202 that may be partially surrounded by the guard ring 204 and the guard region 205. Thus, a substrate resistance of the semiconductor substrate 200 may decrease. Due to the decrease of the substrate resistance, voltage drop between the semiconductor substrate 200 and a source of a MOS transistor may be reduced to suppress snapback.

Figure 4A:
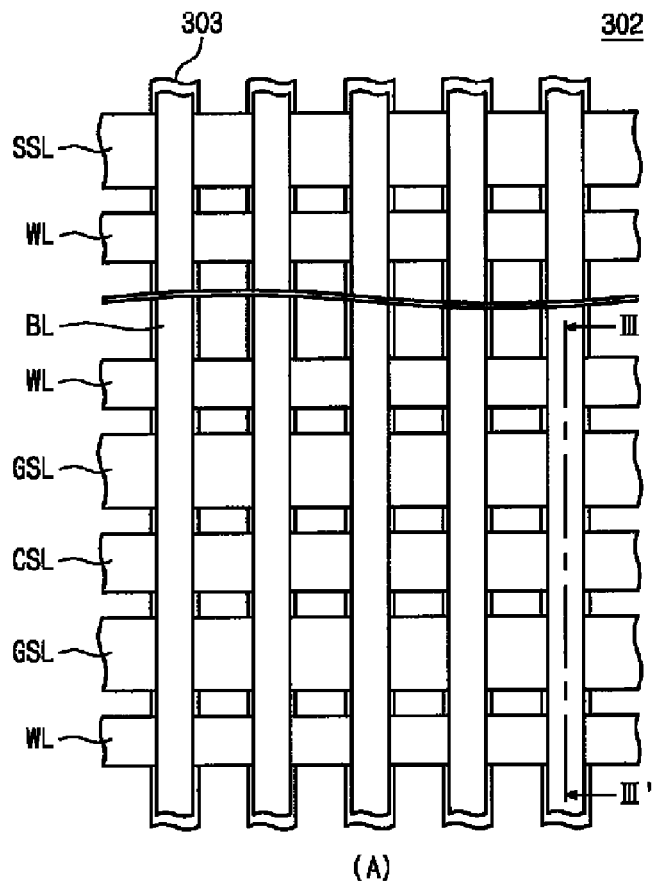
FIGS. 4A through 4C show top plan views and cross-sectional views of a NAND flash memory including a cell region and a peripheral circuit region according to the present invention.
Figure 4A:
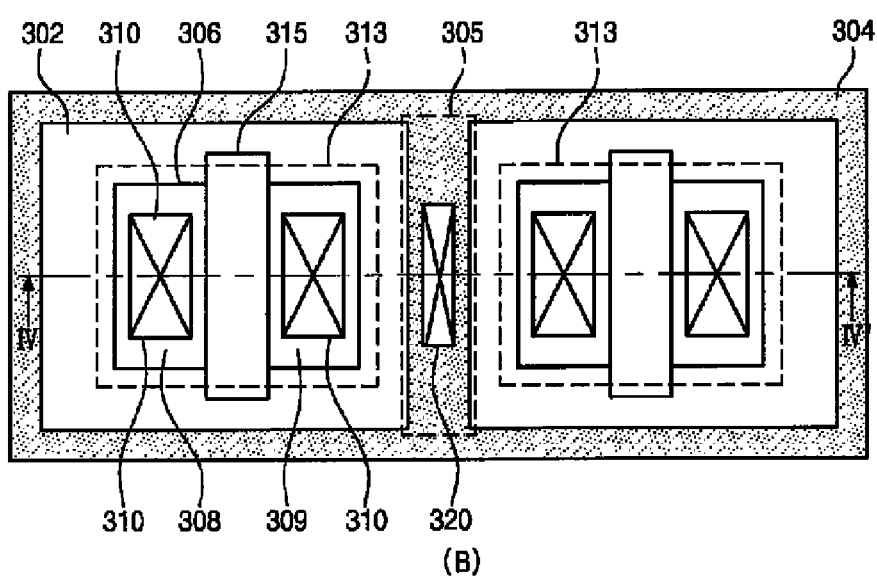
Figure 4B:
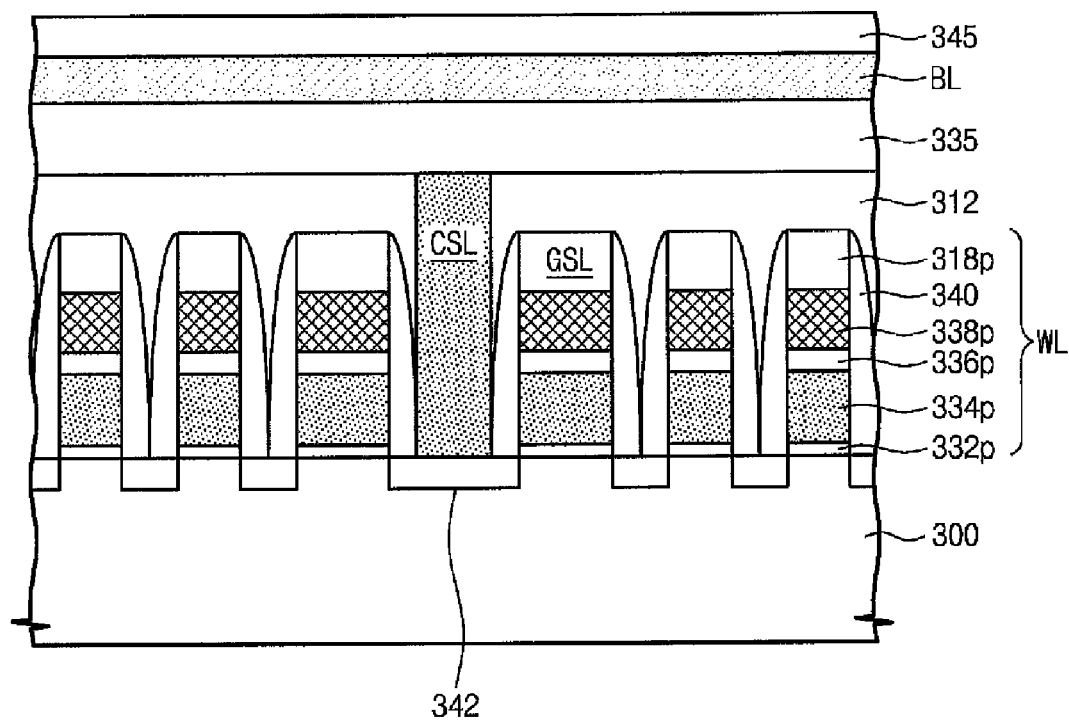

FIG. 4A includes top plan views of a NAND flash memory including a cell region and a peripheral circuit region according to the present invention. FIG. 4B is a cross-sectional view taken along a line III-III' of FIG. 4A, and FIG. 4C is a cross-sectional view taken along a line IV-IV' of FIG. 4A.

Figure 4C:
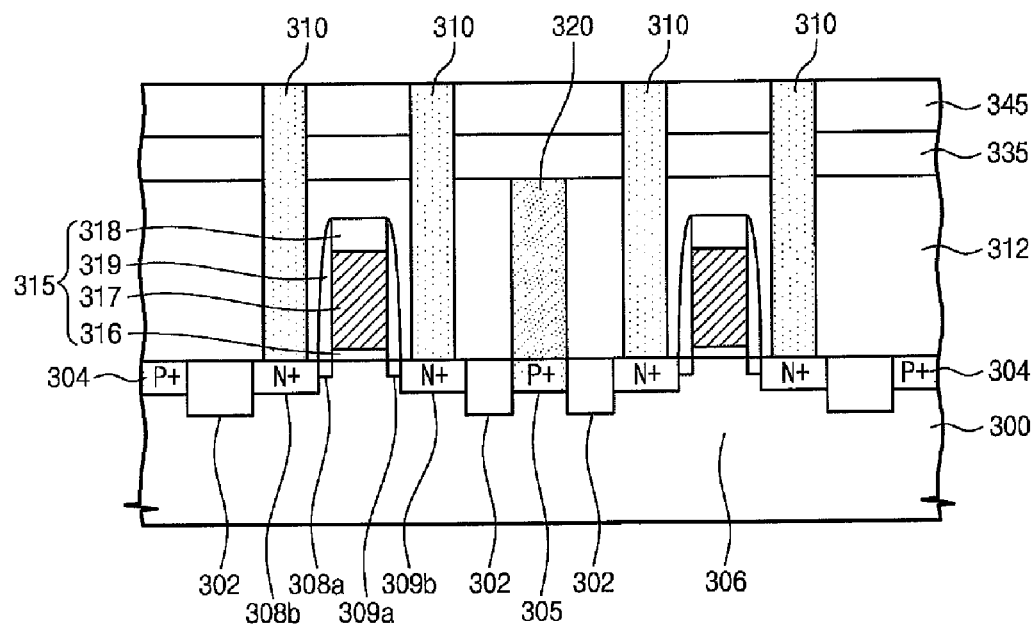

Referring to FIGS. 4A through 4C, a NAND non-volatile memory device according to embodiments of the present invention includes a semiconductor substrate 300 having a cell region "A" and a peripheral circuit region "B".

At the cell region "A", a device isolation layer 302 is disposed on the semiconductor substrate 300 to define cell active regions 303. The cell active regions 303 extend in a first direction. A string selection line SSL and a ground selection line GSL cross the cell active region 303, and a plurality of wordlines WL cross the cell active region between the lines SSL and GSL. The string selection line SSL, the ground selection line GSL, and the wordlines WL extend in another direction which intersects the first direction. The string selection line SSL, the wordlines WL, and the ground selection line GSL may be included in a cell string group. A plurality of cell string groups may be mirror-symmetrically arranged iteratively in the first direction.

Impurity regions 342 corresponding to a source and a drain may be disposed at cell active regions 303 adjacent to opposite sides of the string selection line SSL, the wordlines WL, and the ground selection line GSL.

The wordlines WL may include a tunnel insulator 332$p$, a charge storage pattern 334$p$, a blocking insulating pattern 336$p$, a control gate electrode 338$p$, and a cell spacer 340. A hard mask pattern 318$p$ may be disposed on the control gate electrode 338$p$. The ground selection line GSL and the string selection line SSL may have the same structure as the wordlines WL. However, widths of the lines SSL and GSL may be different from that of the respective wordlines WL. In particular, the width of the respective lines SSL and GSL may be larger than that of the respective wordlines WL. A butting contact (not shown) may be formed by entirely or partially removing the blocking insulating pattern 336$p$ at the string selection line SSL and the ground selection line GSL. The formation of the butt contact may enable the charge storage pattern 334$p$ and the control gate electrode 338$p$ to come in contact with each other. A lower interlayer dielectric 312 may be disposed to cover the wordline WL.

A common source line CSL may be disposed at the source adjacent to the ground selection line GSL, extending along the wordline WL. The common source line CSL may be provided within the lower interlayer dielectric 312 and include at least one of polysilicon and tungsten. An intermediate interlayer dielectric 335 may be disposed on a semiconductor substrate 300 where the common source line CSL is disposed. A bitline contact plug BC (not shown) may be disposed at the drain adjacent to the string selection line SSL through the intermediate interlayer dielectric 335 and the lower interlayer dielectric 312. The bitline contact plug BC may be connected to the bitline BL extending in the first direction and include at least one of polysilicon or tungsten. An upper interlayer dielectric 345 may be disposed on the bitline BL.

At the peripheral circuit region "B", high-voltage elements may include a plurality of MOS transistors 313, a device isolation layer 302, a guard ring 304, and a guard region 305 on a semiconductor substrate 300. The device isolation layer 302 may be disposed to surround the respective MOS transistors 313. The device isolation layer 302 is provided to define peripheral circuit active regions 306. The device isolation layer 302 may be formed by means of a shallow trench isolation (STI) process. The guard ring 304 is disposed to surround the device isolation layer 302 and the MOS transistors 313. The guard region 305 may be disposed between MOS transistors 313 that are adjacent to each other. Thus, each of the MOS transistors 313 may be surrounded by the device isolation layer 302, the guard ring 304, and the guard region 305.

Each of the MOS transistors 313 may include a gate 315, a source 308, and a drain 309. The source/drain 308 and 309 may include a lightly doped drain (LDD) structure. That is, the source/drain 308 and 309 may include first source/drain 308a and 309a which are lightly doped and second source/drain 308b and 309b which are heavily doped.

The source 308 and the drain 309 of the respective MOS transistors 313 may correspond to an emitter and a collector of a parasitic bipolar transistor, respectively. A semiconductor substrate 300 between the source 308 and the drain 309 may correspond to a base of the parasitic bipolar transistor.

The guard ring 304 and the guard region 305 may be disposed to entirely surround the respective MOS transistors 313 and doped with $P^+$ impurities. According to a modified embodiment, the guard ring 304 and the guard region 305 may be disposed to partially surround the respective MOS transistors 313.

The guard region 305 may be grounded through a guard contact plug 320. According to a modified embodiment, the guard region 305 and/or the guard ring 304 may be grounded through the guard contact plug 320. The MOS transistors 313 surrounded by the guard ring 304 and the guard region 305 may decrease in substrate resistance. Thus, snapback may be suppressed.

Gates of the MOS transistors 313 may include a gate insulator 316, a gate electrode 317, a capping pattern 318, and a spacer 319. A lower interlayer dielectric 312 may be disposed to cover the gates 315. An intermediate interlayer dielectric 335 and an upper interlayer dielectric 345 may be sequentially stacked on the lower interlayer dielectric 312. The guard contact plug 320 may be disposed within the lower interlayer dielectric 312. The first source/drain 308a and 309a may be aligned with the gate electrode 317, and the second source/drain 308b and 309b may be aligned with the spacer 319. The source/drain 308 and 309 of the MOS transistors 313 may be connected to a contact plug 310.

The gate insulator 316 may be formed to include at least one selected from the group consisting of silicon oxide, silicon oxynitride, and metal nitride. The gate electrode 317 may include doped polysilicon. The gate electrode 317 may have a multi-layer structure such as, for example, doped polysilicon and metal or metal silicide which are stacked in that order. The capping pattern 318 may include at least one of silicon nitride and silicon oxynitride. During the formation of the gate electrode 317, the capping pattern 318 may act as a hard mask. Sidewalls of the gate insulator 316, the gate electrode 317, and the capping pattern 318 may be aligned with one another.

The spacer 319 may be disposed on the sidewall of the gate electrode 317. The spacer 319 may include at least one selected from the group consisting of silicon nitride, silicon oxynitride, and silicon nitride.

The source/drain 308 and 309 may be formed by introducing or diffusing impurities to the semiconductor substrate 300. The source/drain 308 and 309 may be doped with N-type impurities. A conductivity type of the impurities of the source/drain 308 and 309 may be opposite to that of the semiconductor substrate 300.

The guard ring 304 and the guard region 305 may be formed by introducing or diffusing impurities to the semiconductor substrate 300. The guard ring 304 and the guard region 305 may be doped with P-type impurities. The impurities of the guard ring 304 may have the same conductivity type as the impurities of the guard region 305. The impurities of the guard ring 304 may come in contact with those of the guard region 305. The guard ring 304 and the guard region 305 may have the same conductivity type as the semiconductor substrate 300 and have a different conductivity from the source/drain 308 and 309. The lower interlayer dielectric 312 may be formed to cover the gate 315 and made of silicon oxide. A top surface of the lower interlayer dielectric 312 may be planarized.

The guard contact plug 320 may be disposed in the lower interlayer dielectric 312 to be in contact with the guard region 305. In a modified embodiment of the invention, the guard contact plug 320 maybe disposed on the guard region 305 and/or the guard ring 304. For example, the guard contact plug 320 may be disposed on the guard region 305 and the guard ring 304 therealong.

The guard contact plug 320 may include at least one selected from the group consisting of doped polysilicon, metal, metal silicide, and barrier metal. The guard contact plug 320 may have a multi-layer structure. The guard contact plug 320 and a common source line CSL of a cell region "A" may be formed of the same material by means of the same process. An intermediate interlayer dielectric 335 and an upper interlayer dielectric 345 may be sequentially stacked on the lower interlayer dielectric 312.

The contact plug 310 may be disposed to come in contact with the second source/drain 308b and 309b through the intermediate interlayer dielectric 335 and the upper interlayer dielectric 345. The contact plug 310 may include at least one selected from the group consisting of polysilicon, metal, metal silicide, and barrier metal. The contact plug 310 may be connected to a metal interconnection (not shown) and have a multi-layer structure. In a modified embodiment of the invention, the contact plug 310 may include a landing pad (not shown).

Each of the MOS transistors 313 may be surrounded by the device isolation layer 302, and the MOS transistor 313 and the device isolation layer 302 surrounding the MOS transistor 312 may be surrounded by the guard ring 304 and the guard region 305. Thus, substrate resistance of the semiconductor substrate 300 may decrease. Due to decrease of the substrate resistance, a voltage drop between a source of a MOS transistor and the semiconductor substrate 300 may be reduced to suppress snapback.

A method of forming a high-voltage element according to the present invention will be described below in detail.

FIGS. 5A, 6A, 7A, 8A, 9A, 10A, 11A and 12A (FIGS. 5A through 12A) and FIGS. 5B, 6B, 7B, 8B, 9B, 10B, 11B and 12B (FIGS. 5B through 12B) include cross-sectional views of a NAND flash memory including a cell region and a peripheral circuit region according to an embodiment of the present invention. FIGS. 5A through 12A are cross-sectional views taken along a line of FIG. 4A, and FIGS. 5B through 12B are cross-sectional views taken along a line of IV-IV' of FIG. 4A.

Figure 5A:
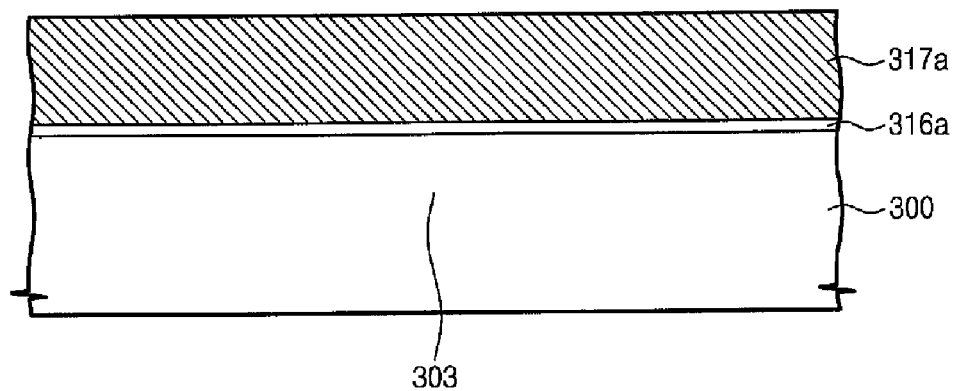
FIGS. 5A, 6A, 7A, 8A, 9A, 10A, 11A and 12A are cross-sectional views of a cell region of a NAND flash memory according to the present invention.
Figure 5B:
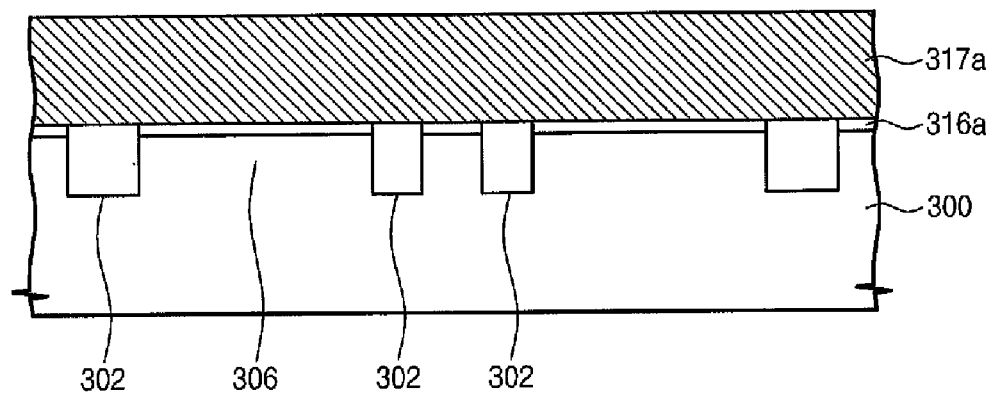
FIGS. 5B, 6B, 7B, 8B, 9B, 10B, 11B and 12B are cross-sectional views of a peripheral region of a NAND flash memory device according to the present invention.

Referring to FIGS. 5A and 5B, a device isolation layer 302 is formed on a semiconductor substrate 300 including a cell region "A" and a peripheral circuit active region "B" to define a cell active region 303 and a peripheral circuit region 306. The cell active region 303 is defined in the cell region "A", and the peripheral circuit active region 306 is defined in the peripheral circuit region "B". A gate insulator 316a may be formed on the entire surface of the semiconductor substrate 300.

The gate insulator 316a may be formed on the peripheral circuit region "B" and the cell region "A". The gate insulator 316a formed on the peripheral circuit region "B" may be a high-voltage gate insulator having a large thickness to control a high voltage. The gate insulator 316a formed on the peripheral circuit region "B" may include a high-voltage gate insulator for a high-voltage element and a low-voltage gate insulator for a low-voltage element. The low-voltage element may be formed at a low-voltage region.

The gate insulator 316a formed on the cell active region 303 may be equivalent to the high-voltage gate insulator or the low-voltage gate insulator. A method of forming the low-voltage gate insulator and the high-voltage gate insulator having different thicknesses will now be described in detail. A high-voltage gate insulator is formed on the entire surface of the semiconductor substrate 300. The high-voltage gate insulator formed on the low-voltage region and/or the cell region "A" is removed. A low-voltage gate insulator is formed on the entire surface of the semiconductor substrate.

A gate conductive layer 317a is formed on the semiconductor substrate where the gate insulator 316a is formed. The gate conductive layer 317a may be formed of doped polysilicon. The polysilicon may be doped by means of ion implantation or in-situ doping. The gate conductive layer 317a may have a multi-layer structure such as, for example, doped polysilicon and metal or metal silicide that are stacked in that order. The metal silicide may include at least one selected from the group consisting of WSi, TiSi, TaSi, and CoSi.

A semiconductor device according to a modified embodiment of the invention may include an etch-stop layer (not shown) formed on the gate insulator 317a. The etch-stop layer may be formed of silicon nitride or silicon oxide.

Figure 6A:
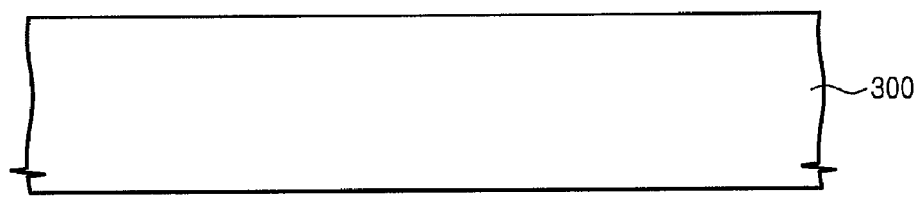
Figure 6B:
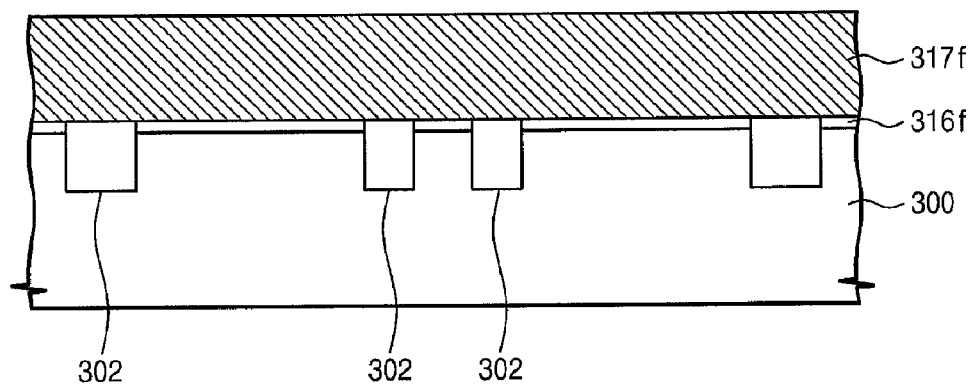

Referring to FIGS. 6A and 6B, a mask pattern (not shown) is formed at the peripheral circuit region "B". Using he mask pattern as an etch mask, the gate conductive layer 317a and the gate insulator 316a of the cell region "A" are removed to form a preliminary gate conductive layer 317f and a preliminary gate insulator 316f at the peripheral circuit region "B". Their removal may be done by means of wet etch.

Figure 7A:
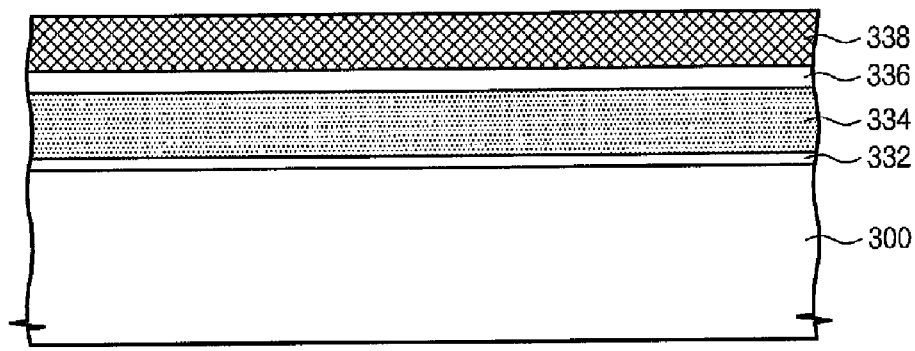
Figure 7B:
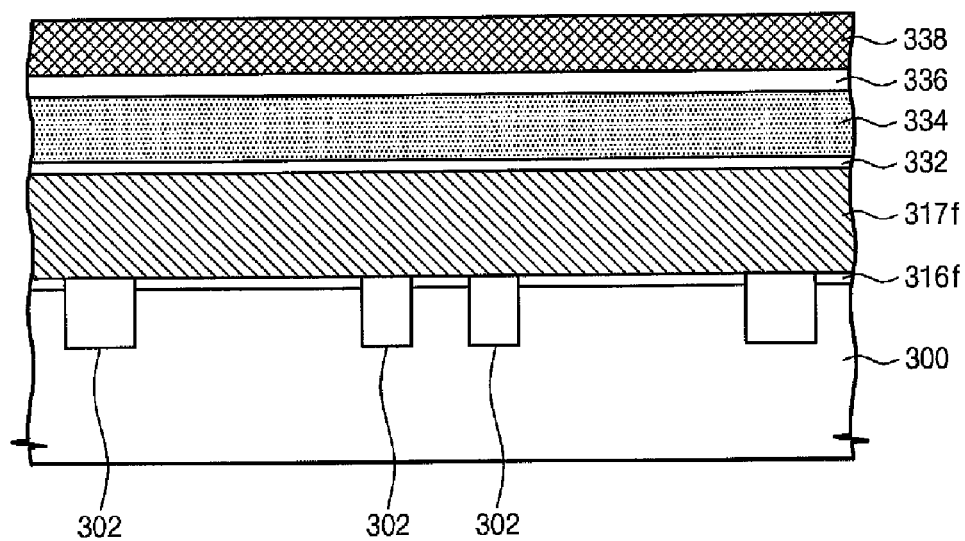

Referring to FIGS. 7A and 7B, a tunnel insulator 332, a charge storage layer 334, a blocking insulating layer 336, and a control gate conductive layer 338 are sequentially formed on the semiconductor substrate 300. The tunnel insulator 332 may include at least one selected from the group consisting of silicon oxide, silicon oxynitride, and metal oxide. The charge storage layer 334 may include at least one selected from the group consisting of doped polysilicon, metal, metal silicide, and silicon nitride. The charge storage layer 334 may be a conductive layer or a dielectric layer. In the case where the charge storage layer 334 is a dielectric layer, it may be charge trapping means. The blocking insulating layer 336 may have a single layer structure or a multi-layer structure. In the case where the blocking insulating layer 336 has a multi-layer structure, it may include at least one high-k dielectric layer. The high-k dielectric layer may have a higher dielectric constant than a silicon oxide layer and include one selected from the group consisting of aluminum oxide ($Al_2O_3$), hafnium oxide ($HfO_2$), hafnium aluminum oxide (HfAlO), hafnium silicon oxynitride (HfSiON) or tantalum oxide ($Ta_2O_5$).

The control gate conductive layer 338 may have a single layer structure or a multi-layer structure. In the case where the control gate conductive layer 338 has a single layer structure, the control gate conductive layer 338 may be formed of one selected from the group consisting of doped polysilicon, metal, and metal silicide. In the case where the control gate conductive layer 338 has a multi-layer structure, the control gate conductive layer 338 may include at least one selected from the group consisting of doped polysilicon, metal, metal silicide, and metal compound. The control gate conductive layer 338 may include at least one selected from the group consisting of tantalum nitride (TaN), tantalum (Ta), ruthenium (Ru), tungsten nitride (WN), titanium (Ti), titanium nitride (TiN), tantalum titanium (TaTi), tantalum platinum (TaPt), tantalum silicon nitride (TaSiN), hafnium nitride (HfN), titanium aluminum nitride ($Ti_2AlN$), molybdenum (Mo), and platinum (P).

Figure 8A:
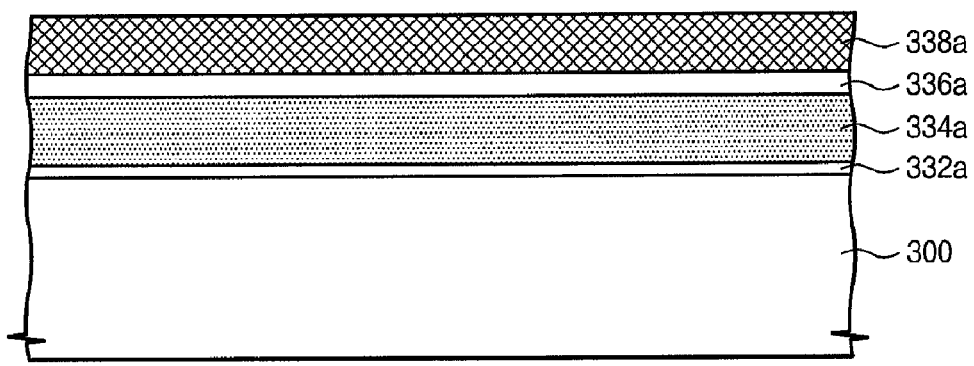
Figure 8B:
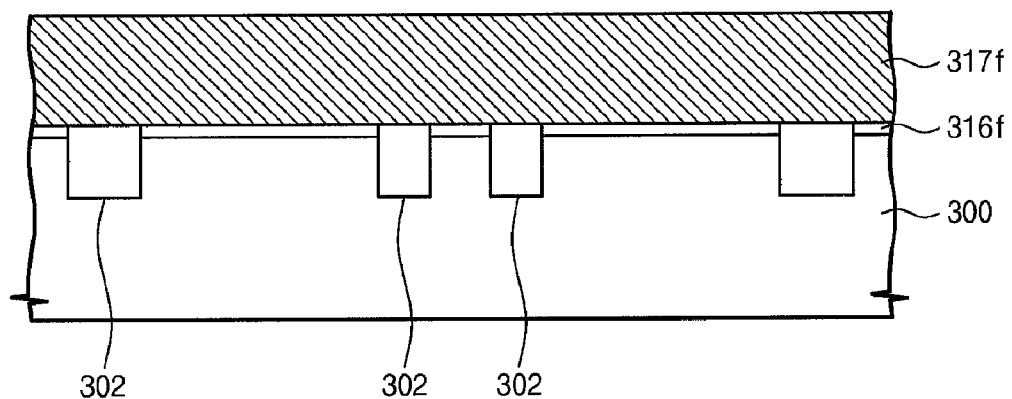

Referring to FIGS. 8A and 8B, a mask pattern (not shown) is formed at the cell region "A". Using the mask pattern as an etch mask, the control gate conductive layer 338, the blocking insulating layer 336, the charge storage layer 334, and the tunnel insulator 332 of the peripheral circuit region "B" are successively removed to form a preliminary control gate conductive layer 338a, a preliminary blocking insulating layer 336a, a preliminary gate conductive layer 334a, and a preliminary tunnel insulator 332a. Their removal may be done by means of wet etch.

Figure 9A:
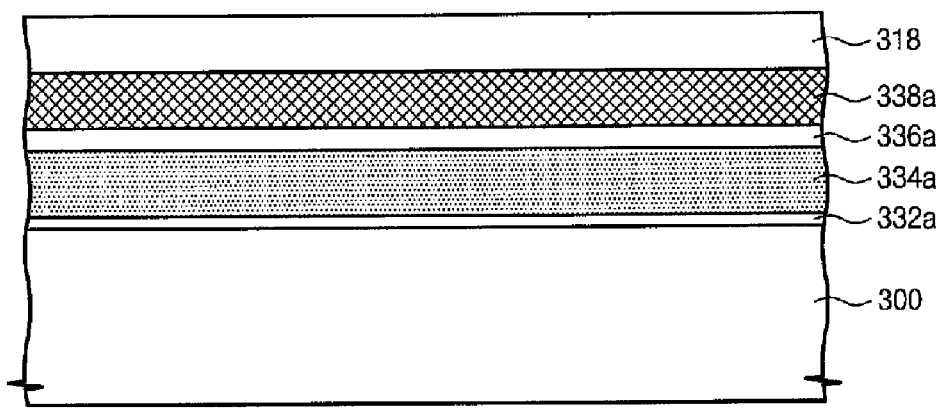
Figure 9B:
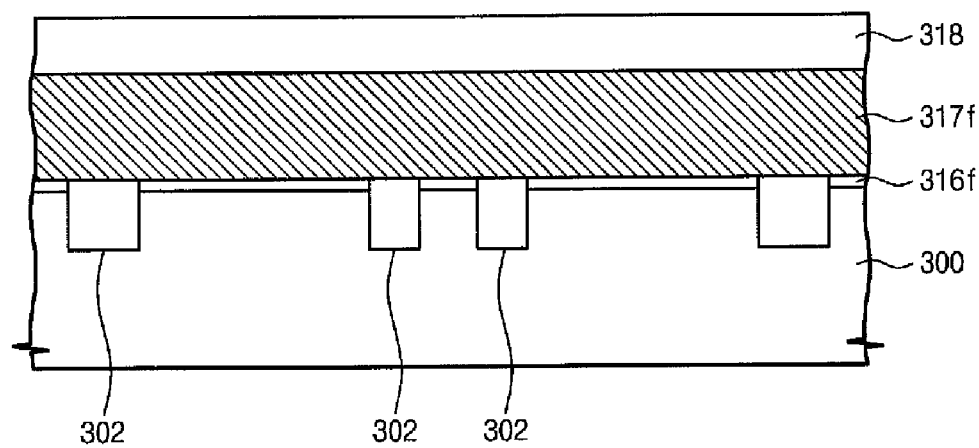

Referring to FIGS. 9A and 9B, a hard mask layer 318 is formed on the semiconductor substrate 300. The hard mask layer 318 may include at least one selected from the group consisting of silicon oxide, silicon oxynitride, and silicon nitride. The hard mask layer 318 may be formed of tetraethyl-ortho-silicate (TEOS) formed by means of chemical vapor deposition (CVD) or middle temperature oxide (MTO).

Figure 10A:
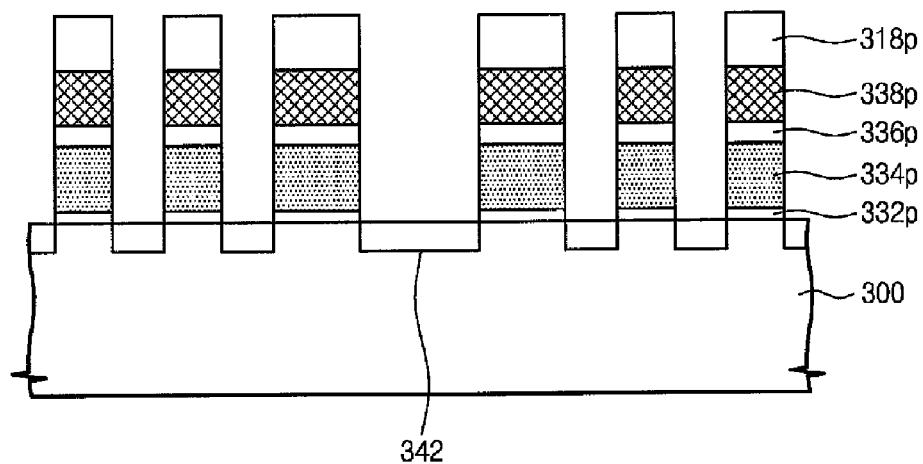
Figure 10B:
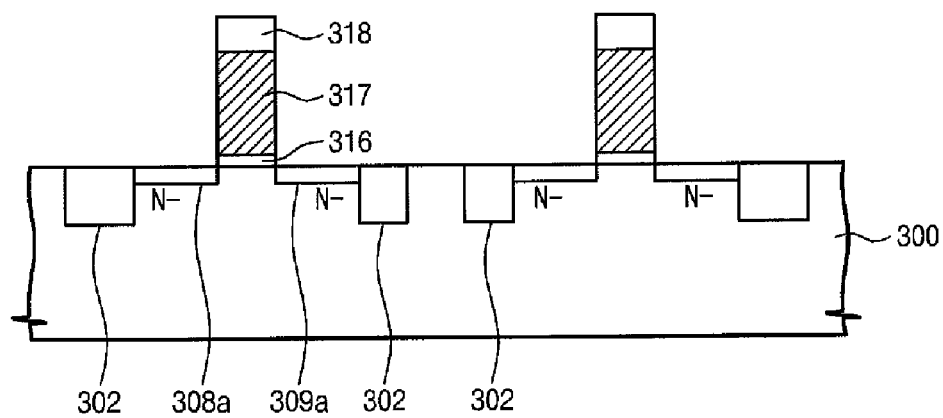

Referring to FIGS. 10A and 10B, a gate mask pattern (not shown) is formed at the cell region "A" and/or the peripheral circuit region "B". Using the gate mask pattern as an etch mask, the hard mask layer 318, the preliminary control gate conductive layer 338a, the preliminary blocking insulating layer 336a, and the preliminary charge storage layer 334a of the cell region "A" are successively etched and the hard mask layer 318 and the preliminary gate conductive layer 316f of the peripheral circuit region "B" are successively etched to form a string selection gate SSL, a plurality of wordlines WL, and a ground selection gate GSL, which cross the cell active region 303. The string selection gate SSL, the plurality of wordlines WL, and the ground selection gate GSL may include a hard mask pattern 318p, a control gate electrode 338p, a blocking insulating pattern 336p, and a charge storage pattern 334p. In the peripheral circuit region "B", a capping pattern 318 and a gate electrode 317 are formed. The preliminary tunnel insulator 332a disposed between the charge storage patterns 334p may be removed by means of wet etch to form a tunnel insulator 332p. The preliminary gate insulator disposed between the gate electrodes 317 may be removed by means of wet etch to form a gate insulator 316.

Impurity regions 342 corresponding to source/drain may be formed at a cell active region adjacent to opposite sides of the string selection gate SSL, the plurality of wordlines WL, and the ground selection gate GSL. The impurity regions 342 may be formed by means of ion implantation.

In the peripheral circuit region "B", first source/drain 308a and 309a may be formed at the peripheral circuit active region 306 adjacent to opposite sides of the gate electrode 317. The first source/drain 308a and 309a may be formed by means of ion implantation. The impurity region 342 and the first source/drain 308a and 309a may be formed at the same time.

Figure 11A:
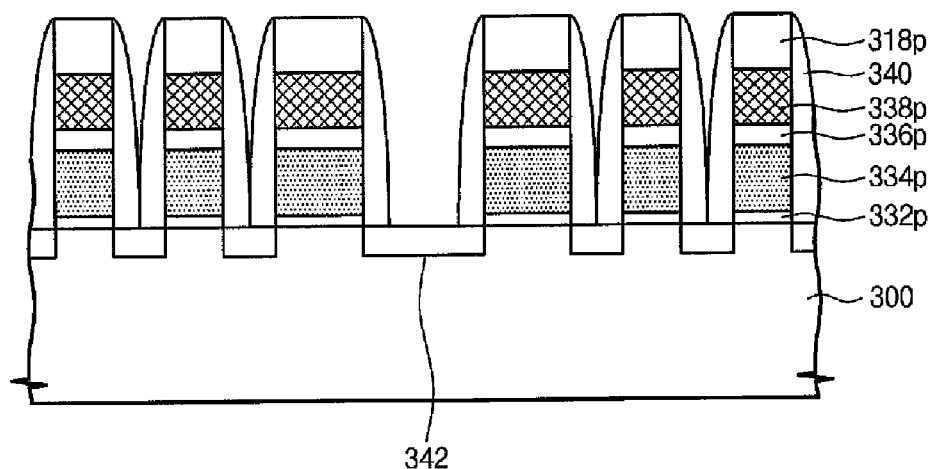
Figure 11B:
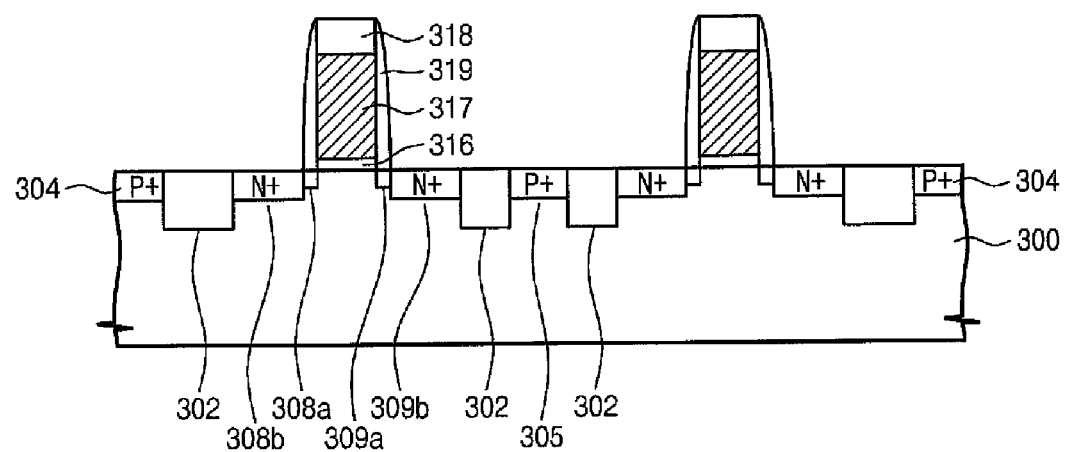

Referring to FIGS. 11A and 11B, a spacer layer (not shown) is conformally formed on the entire surface of the semiconductor substrate 300. The spacer layer may be anisotropically etched to form a cell spacer 340 at the cell region "A" and a spacer 319 at the peripheral circuit region "B". Following the formation of the spacer 319, an additional ion implantation process may be carried out to form second source/drain 308b and 309b of the peripheral circuit region "B". Source/drain of a high-voltage element may include the first source/drain 308a and 309a and the second source/drain 308b and 309b.

The guard ring 304 and the guard region 305 may be formed by means of an ion implantation process using a guard ring mask pattern (not shown) and a guard region mask pattern (not shown) as masks. The guard ring 304 and the guard region 305 may be formed at the same time. The ions for use in the ion implantation process may be P-type impurities. The guard ring mask pattern and the guard region mask pattern may be formed to open only a portion of the peripheral circuit region "B" where a high-voltage element is disposed.

Figure 12A:
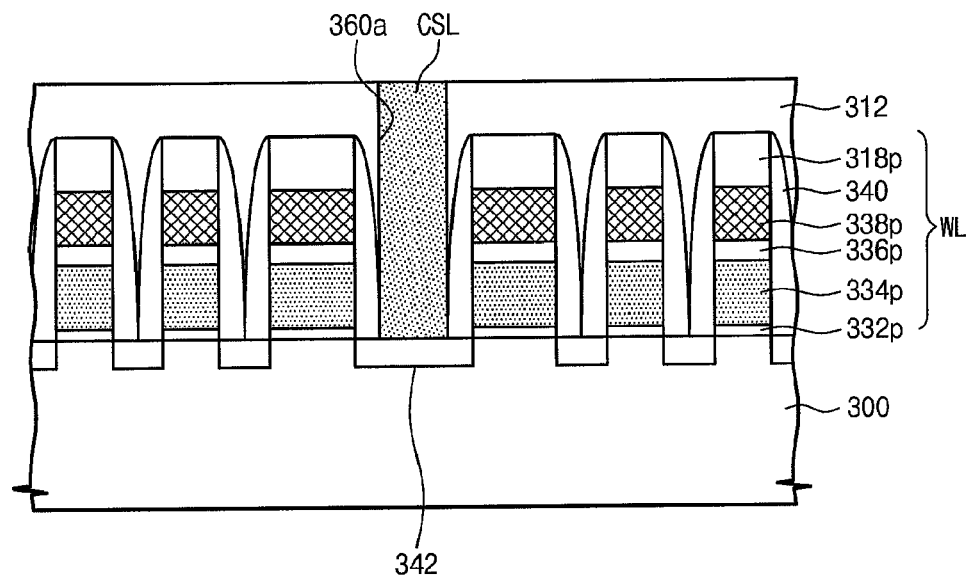
Figure 12B:
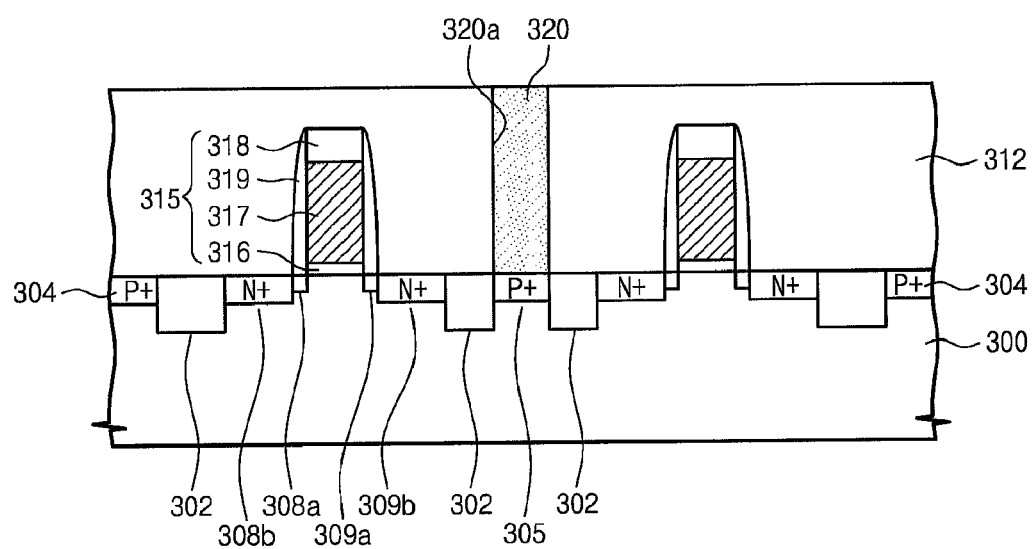

Referring to FIGS. 12A and 12B, a lower interlayer dielectric 312 is formed on the semiconductor substrate 300. A top surface of the semiconductor substrate 300 may be planarized. The lower interlayer dielectric 312 may be formed of silicon oxide. A common source line contact hole 360a may be formed at the cell region "A" to penetrate the lower interlayer dielectric 312. A guard contact hole 320a may be formed at the peripheral circuit region "B" to penetrate the lower interlayer dielectric 312. The guard contact hole 320a may be formed on the guard region 305 and/or the guard ring 304.

A conductive layer may be deposited to fill the common source line contact hole 360a and the guard contact hole 320a. The conductive layer may be planarized to form a guard contact plug and a common source line. That is, at the cell region "A", a common source line CSL may be formed in the lower interlayer dielectric 312 by means of a planarization process to be in contact with the impurity regions 342. At the peripheral circuit region "B", a guard contact plug 320 may be formed in the lower interlayer dielectric 312 to be in contact with the guard region 305.

As described in the modified embodiment, the guard contact plug 320 is in contact with the guard region 305. However, the guard contact plug 320 may be in contact with the guard region 305 and/or the guard ring 304.

Returning to FIGS. 4B and 4C, an intermediate interlayer dielectric 335 is formed on the semiconductor substrate 300 where the common source line CSL and the guard contact plug 320 are formed. A bitline contact plug (not shown) is formed on the intermediate interlayer dielectric 335. A bitline BL is formed on the semiconductor substrate 300 where the bitline contact plug is formed. An upper interlayer dielectric layer 345 is formed on the semiconductor substrate 300 where the bitline BL is formed. A contact plug 310 is formed to be in contact with the second source/drain 308b and 309b through the upper interlayer dielectric 345, the intermediate interlayer dielectric 335, and the lower interlayer dielectric 312. The contact plug 310 may be connected to a metal interconnection (not shown).

According to exemplary embodiments of the invention, there are various methods of forming a wordline WL in a cell region and a gate electrode in a peripheral circuit region.

According to the invention, respective NMOS transistors are surrounded by a device isolation layer, which is surrounded by a guard ring and a guard region. Thus, snapback is suppressed to enhance a reliability of the semiconductor device.

Although the present invention has been described in connection with the embodiment of the present invention illustrated in the accompanying drawings, it is not limited thereto. It will be apparent to those skilled in the art that various substitutions, modifications and changes may be made without departing from the scope and spirit of the invention.

What is claimed is:

1. A method of forming a semiconductor device, comprising:
    forming a plurality of transistors on a semiconductor substrate;
    forming a device isolation layer around the transistors;
    forming a guard ring on the semiconductor substrate to surround the device isolation layer and the transistors;
    forming a guard region on the semiconductor substrate between adjacent transistors, wherein one end of the guard region is in direct contact with the guard ring; and
    forming a guard contact plug on the guard region.

2. The method as set forth in claim 1, wherein the guard region and the guard ring are formed at the same time.

3. The method as set forth in claim 1, wherein the semiconductor substrate comprises a cell region and a peripheral circuit region,
    wherein the cell region comprises:
    memory cells connected in series;
    a string selection element connected to one end of the memory cells connected in series; a ground selection element connected to the other end of the memory cells connected in series; and
    a common source line to connect the ground selection element to an adjacent ground selection element,
    wherein the common source line and the guard contact plug are formed at the same time.

4. The method as set forth in claim 3, wherein the guard contact plug and the common source line are made of the same material.

5. The method as set forth in claim 3, wherein the guard contact plug is grounded.

6. The method as set forth in claim 3, wherein the memory cells comprise:
    a tunnel insulator on a semiconductor substrate;
    a charge storage layer on the tunnel insulator;
    a blocking insulating layer on the charge storage layer; and
    a control gate electrode on the blocking insulating layer.

7. The method as set forth in claim 6, wherein the blocking insulating layer is entirely or partially removed at the string selection element and the ground selection element to contact the charge contact layer with the control gate electrode.

8. The method as set forth in claim 3, wherein a gate structure of the memory cells in the cell region is different from that of the transistors in the peripheral circuit region.

9. The method as set forth in claim 1, wherein the guard region is electrically connected to the guard ring.

10. The method as set forth in claim 1, wherein forming each of the plurality of transistors comprises:
    forming a gate insulator;
    forming a gate electrode on the gate insulator; and
    forming a source and drain.

11. The method as set forth in claim 10, wherein the source and drain are N-type impurity regions formed on the semiconductor substrate, and the guard ring and the guard region exhibit P-type conductivity.

12. The method as set forth in claim 11, wherein the source and drain are connected to a metal contact plug.

13. The method as set forth in claim 12, wherein the guard region is grounded.

14. The method as set forth in claim 1, wherein the plurality of transistors are high-voltage NMOS elements.

15. The method as set forth in claim 1, wherein both ends of the guard region are in contact with the guard ring.

16. The method as set forth in claim 1, wherein the other end of the guard region is not in contact with the guard ring.

17. The method as set forth in claim 1, wherein the semiconductor substrate is a P-type semiconductor substrate and the guard ring is a P-type guard ring.

* * * * *